US011373999B2

(12) United States Patent
Wang et al.

(10) Patent No.: US 11,373,999 B2
(45) Date of Patent: Jun. 28, 2022

(54) DEEP TRENCH VIA FOR THREE-DIMENSIONAL INTEGRATED CIRCUIT

(71) Applicant: Intel Corporation, Santa Clara, CA (US)

(72) Inventors: Yih Wang, Portland, OR (US); Rishabh Mehandru, Portland, OR (US); Mauro J. Kobrinsky, Portland, OR (US); Tahir Ghani, Portland, OR (US); Mark Bohr, Aloha, OR (US); Marni Nabors, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 874 days.

(21) Appl. No.: 16/002,723

(22) Filed: Jun. 7, 2018

(65) Prior Publication Data
US 2019/0378836 A1 Dec. 12, 2019

(51) Int. Cl.
| | |
|---|---|
| *H01L 27/06* | (2006.01) |
| *H01L 21/768* | (2006.01) |
| *H01L 21/8234* | (2006.01) |
| *H01L 23/522* | (2006.01) |
| *H01L 27/088* | (2006.01) |
| *H01L 29/66* | (2006.01) |
| *H01L 29/78* | (2006.01) |

(52) U.S. Cl.
CPC .... *H01L 27/0688* (2013.01); *H01L 21/76877* (2013.01); *H01L 21/823431* (2013.01); *H01L 23/5226* (2013.01); *H01L 27/0886* (2013.01); *H01L 29/66545* (2013.01); *H01L 29/66795* (2013.01); *H01L 29/785* (2013.01)

(58) Field of Classification Search
CPC ............. H01L 27/0688; H01L 27/0886; H01L 21/76877; H01L 21/823431; H01L 23/5226; H01L 29/6675; H01L 29/785
See application file for complete search history.

(56) References Cited

U.S. PATENT DOCUMENTS

| | | | | |
|---|---|---|---|---|
| 2008/0054313 A1* | 3/2008 | Dyer | ................. | H01L 21/76898 257/276 |
| 2013/0320405 A1* | 12/2013 | Jeon | .................... | H01L 27/0207 257/204 |

FOREIGN PATENT DOCUMENTS

| | | |
|---|---|---|
| WO | WO 2017/052562 | 3/2017 |
| WO | WO 2017/171842 | 10/2017 |
| WO | WO 2018/063302 | 4/2018 |

OTHER PUBLICATIONS

Search Report from European Patent Application No. 19172617.3, dated Nov. 13, 2019, 5 pages.

* cited by examiner

*Primary Examiner* — Dale E Page
*Assistant Examiner* — Quovaunda Jefferson
(74) *Attorney, Agent, or Firm* — Schwabe, Williamson & Wyatt, P.C.

(57) ABSTRACT

Described herein are apparatuses, methods, and systems associated with a deep trench via in a three-dimensional (3D) integrated circuit (IC). The 3D IC may include a logic layer having an array of logic transistors. The 3D IC may further include one or more front-side interconnects on a front side of the 3D IC and one or more back-side interconnects on a back side of the 3D IC. The deep trench may be in the logic layer to conductively couple a front-side interconnect to a back-side interconnect. The deep trench via (Continued)

may be formed in a diffusion region or gate region of a dummy transistor in the logic layer. Other embodiments may be described and claimed.

26 Claims, 10 Drawing Sheets

DEEP TRENCH VIA FOR THREE-DIMENSIONAL INTEGRATED CIRCUIT

TECHNICAL FIELD

Embodiments of the disclosure are in the field of integrated circuits and, in particular, to deep trench vias for three-dimensional integrated circuits.

BACKGROUND

In three-dimensional (3D) integrated circuits (ICs), there are circuit devices and/or metal layers (e.g., interconnects) on both the front side and the back side of the logic layer (e.g., that includes logic transistors of the 3D IC). Some 3D ICs include through-silicon vias (TSVs) to pass through the logic layer, around the regions having transistors. However, TSVs have large dimensions and pitch, making them unsuitable for high-density use. Additionally, TSVs have high capacitance, which is not desirable for high-speed input/output (I/O).

DESCRIPTION OF THE EMBODIMENTS

Figure 1A:
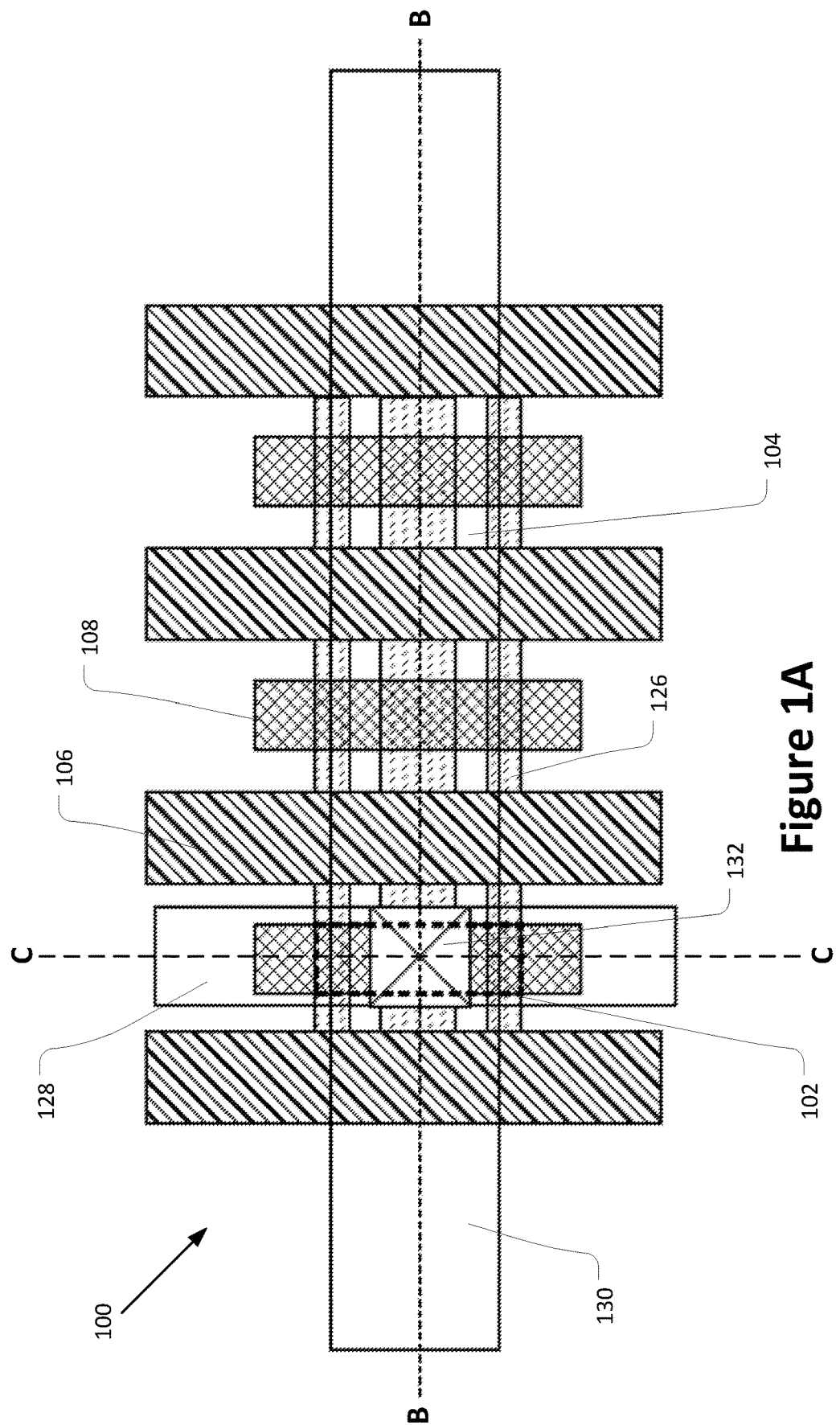
FIG. 1A illustrates a top view of an integrated circuit (IC) structure including a deep trench via in a logic layer of the IC structure, in accordance with various embodiments.

Described herein are techniques for deep trench vias in three-dimensional (3D) integrated circuits (ICs), and associated methods, apparatuses, and systems. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only nonplanar transistors, it should be noted that the disclosure may also be carried out using planar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions (also referred to herein as "diffusion regions") are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Various embodiments described herein are directed to techniques for deep trench vias in a 3D IC. In various embodiments, the 3D IC may include a logic layer that includes logic transistors (e.g., in a transistor array). In some embodiments, the logic transistors may be nonplanar transistors (e.g., finFETs). For example, a plurality of fins may be formed in the logic layer, and gate stacks and diffusion electrodes (e.g., source or drain electrodes) may be formed on the fins to form transistors.

The 3D IC may further include front-side interconnects in one or more metal layers on a front side of the 3D IC (e.g., above the substrate on which the logic transistors are formed) and back-side interconnects in one or more metal layers on a back side of the 3D IC (e.g., below the substrate on which the logic transistors are formed). In some embodiments, the substrate may be partially or completely removed after formation of the logic transistors.

In various embodiments, the 3D IC may further include one or more deep trench vias that extend through the logic layer of the 3D IC. The deep trench via may provide a conductive connection between one or more of the front-side interconnects and one or more of the backside interconnects. The individual deep trench vias may be formed in a dummy diffusion region (e.g., source or drain region) and/or a dummy gate region within the transistor array. In some embodiments, the dummy diffusion region and/or dummy gate region may be part of a dummy transistor (e.g., dummy finFET) of the transistor array. For example, finFETS may be at least partially formed in the logic layer, e.g., including semiconductor fins, and gate stacks and diffusion electrodes on the semiconductor fins in respective gate regions and diffusion regions. Then, a trench may be formed in some of the diffusion regions and/or gate regions and filled with a metal, thereby forming the deep trench vias between the back side and front side of the 3D IC. In some embodiments, the fins may also be removed from the trench. In other embodiments, the fins may remain in the trench, and the metal of the deep trench vias may be disposed between and/or around the fins.

The deep trench vias as described herein may enable a high-density and low-capacitance connection for signal routing between the front side and back side of the 3D IC (e.g., between circuit devices and/or interconnects on the front side and back side of the 3D IC).

Additionally, or alternatively, in some embodiments, the deep trench via may provide a conductive connection between a backside interconnect and a logic transistor in the transistor array (e.g., to deliver or receive a voltage and/or electrical power). The deep trench via may be conductively coupled to a diffusion region or gate region of the logic transistor. For example, in some embodiments, the deep trench via may be formed in a dummy gate region and may couple a backside interconnect to the source region of the adjacent logic transistor to route electrical power to the source region.

Figures 1B, 1C:
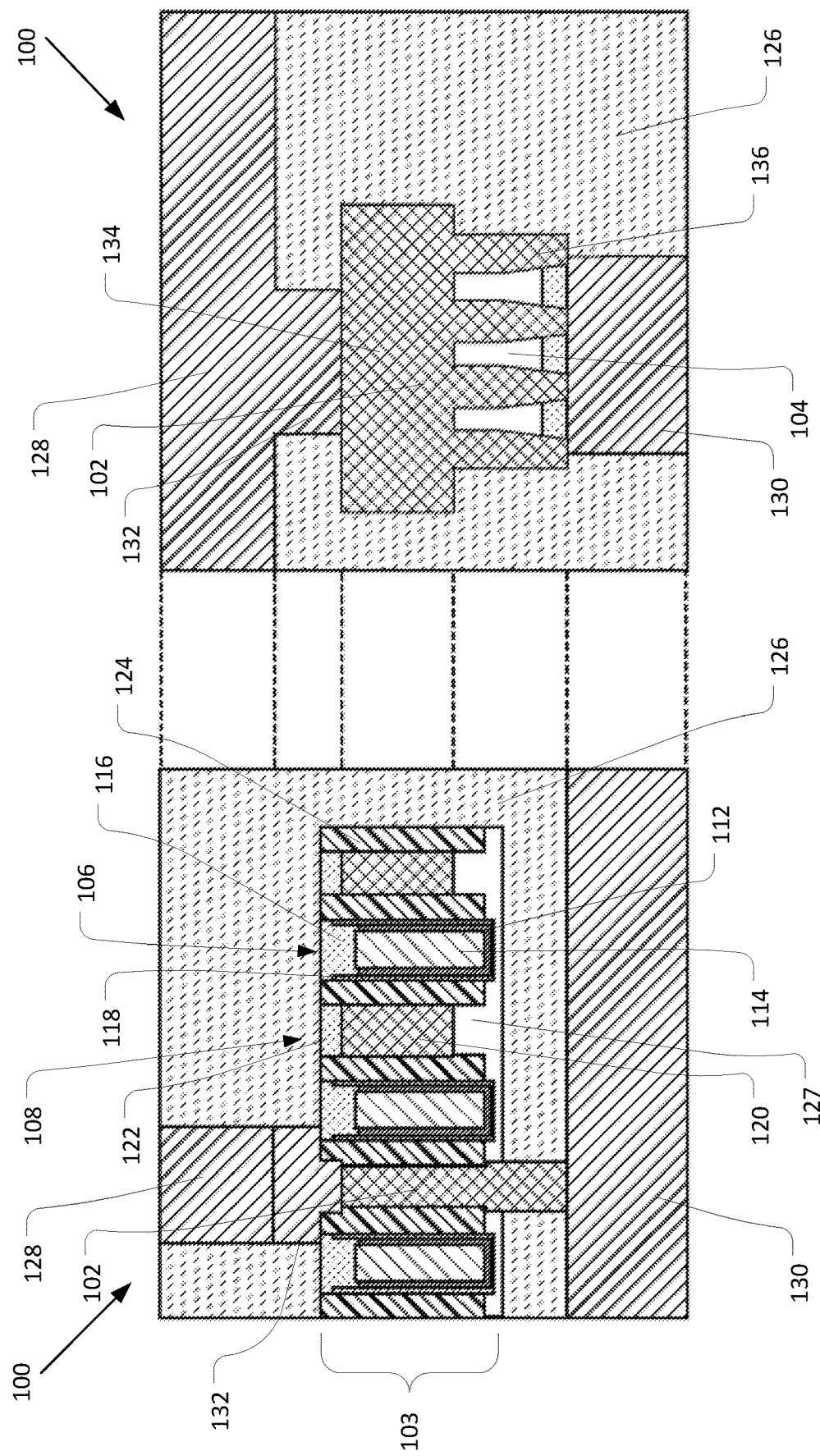
FIG. 1B illustrates a side cross-sectional view of the IC structure of FIG. 1A along the line B-B in FIG. 1A.
FIG. 1C illustrates a side cross-sectional view of the IC structure of FIG. 1A along the line C-C in FIG. 1A.

FIG. 1A illustrates a top view of an IC structure 100 including a deep trench via 102 in accordance with various embodiments. FIG. 1B illustrates a side cross-sectional view along the line B-B in FIG. 1A, and FIG. 1C illustrates a side cross-sectional view along the line C-C in FIG. 1A. The IC structure 100 may be incorporated into a 3D IC. The IC structure 100 may include a logic layer 103 including a plurality of fins 104 of a semiconductor material (e.g., silicon and/or another suitable material). The IC structure 100 may further include a gate stack 106 on a top surface and sidewalls of the fins 104 in respective gate regions, and diffusion electrodes 108 on a top surface and sidewalls of the fins 104 in respective diffusion regions.

The gate stack 106 may include a gate electrode including one or more layers, such as gate electrode layer 112, gate electrode layer 114, and/or gate electrode layer 116. The gate electrode layers 112, 114, and/or 116 may include any suitable material or materials, as described herein. The gate stack 106 may further include a gate dielectric 118 between the gate electrode and the fin 104. The gate dielectric 118 may include any suitable material or materials, as described herein. The diffusion electrodes 108 may include one or more layers, such as diffusion electrode layer 120 and/or diffusion electrode layer 122. The diffusion electrode layers 120 and/or 122 may include any suitable materials as described herein for source/drain contacts.

In some embodiments, the IC structure 100 may further include spacers (e.g., sidewall spacers) 124 between the diffusion electrodes 108 and the gate electrodes 106. Additionally, or alternatively, a dielectric 126 and/or a dielectric 127 may be between the fins 104, above the logic layer 103, and/or below the logic layer 103. The dielectric 126 and/or dielectric 127 shown in FIGS. 1A, 1B, and 1C may include one or more dielectric materials.

In various embodiments, the deep trench via 102 may extend through the logic layer 103. As shown in FIGS. 1A, 1B, and 1C, the deep trench via 102 may be in a diffusion region of the logic layer 103 (e.g., of a dummy transistor in the logic layer 103) that would normally include a diffusion electrode 108 (e.g., for a logic transistor in the transistor array). The deep trench via 102 may provide a conductive connection between a front-side interconnect 128 and a back-side interconnect 130. In some embodiments, one or more vias (e.g., via 132) may couple the deep trench via 102 to the front-side interconnect 128 and/or the back-side interconnect 130.

Spacers 124 may be between the deep trench via 102 and adjacent gate stacks 106. Additionally, the dielectric 126 may be between the deep trench via 102 and adjacent fins 104 that form transistors of the transistor array.

The deep trench via 102 may include any suitable conductor, such as one or more metals, including, but not limited to, copper, tungsten, tantalum, ruthenium, titanium, tantalum and nitrogen (e.g., TaN), titanium and nitrogen (e.g., TiN), etc. The deep trench via 102 may be formed of the same material or a different material from the front-side interconnect 128, the back-side interconnect 130, and/or the via 132. Additionally, or alternatively, the deep trench via 102 may be formed of the same material or a different material as a material of the diffusion electrode 108 (e.g., the diffusion electrode layer 120 and/or 122).

In some embodiments, the deep trench via 102 may include a first portion 134 and a second portion 136, with the first portion 134 having a larger width than the second portion 136 (e.g., in a direction that is transverse to the orientation of the fins 104), as shown in FIG. 1C. The first portion 134 may be coplanar with the diffusion electrodes 108 of adjacent transistors in the logic layer 103. The second portion 136 may be below the first portion 134, and may couple the first portion 134 to the back-side interconnect 130. In some embodiments, the first portion 134 and second portion 136 may be formed by separate deposition processes, during formation of the deep trench via 102. The first portion 134 and second portion 136 may be the same or different materials.

In various embodiments, the deep trench via 102 may extend across multiple fins 104. For example, in some embodiments, the transistors formed by the fins 104 may be tri-gate transistors, and the deep trench via 102 may extend across three fins 104. In some embodiments, a portion or all of the fins may be preserved within the deep trench via 102, as shown in FIG. 1C. The conductive material of the deep trench via 102 may be between the fins 104. The selective epitaxial growth of semiconductor fins 104 in a typical junction is blocked by a patterned resist layer, thereby allowing the conductive material filled between the fins 104 to electrically couple the front-side interconnect 128 and the back-side interconnect 130.

Figure 2A:
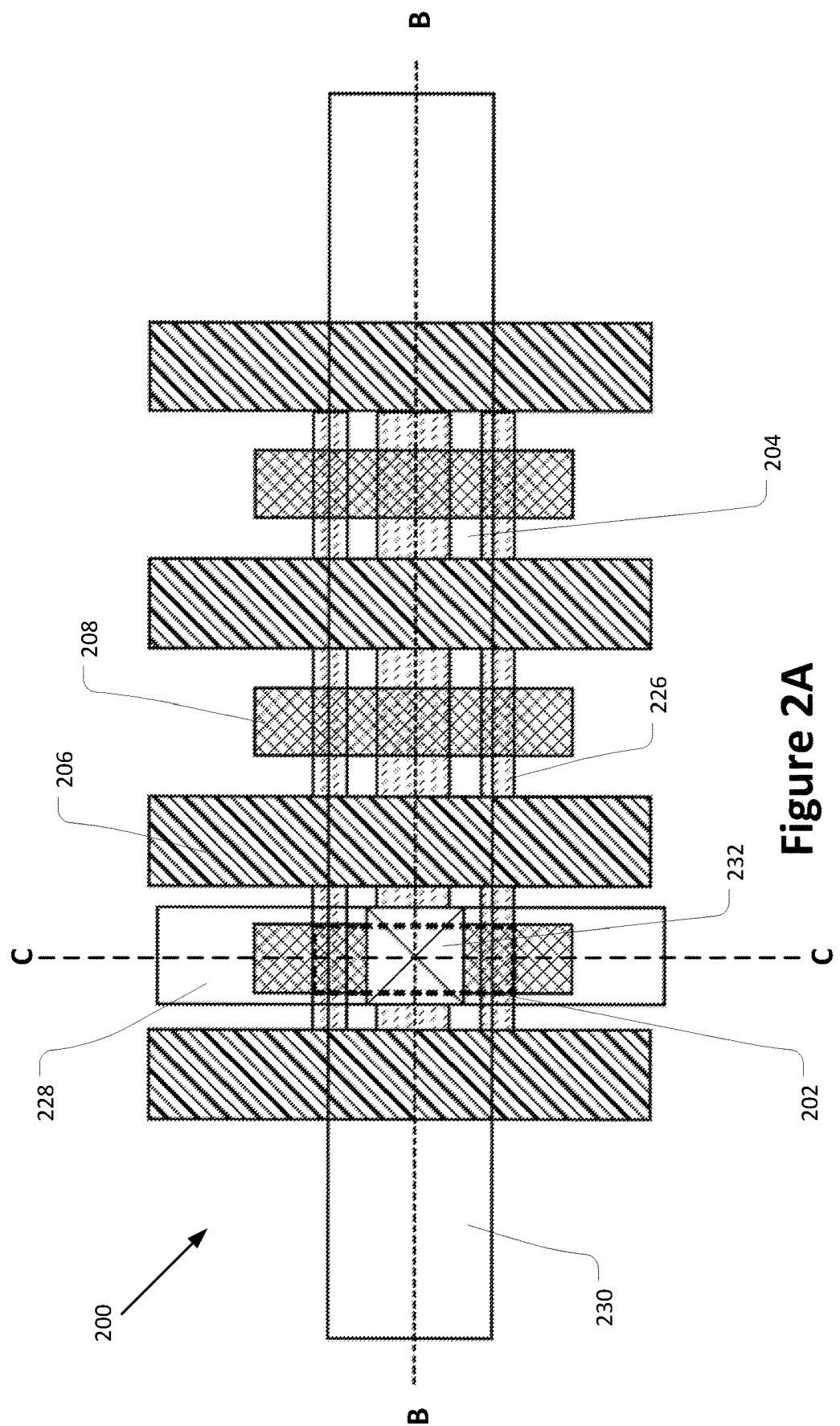
FIG. 2A illustrates a top view of another IC structure including a deep trench via in a logic layer of the IC structure, in accordance with various embodiments.
Figures 2B, 2C:
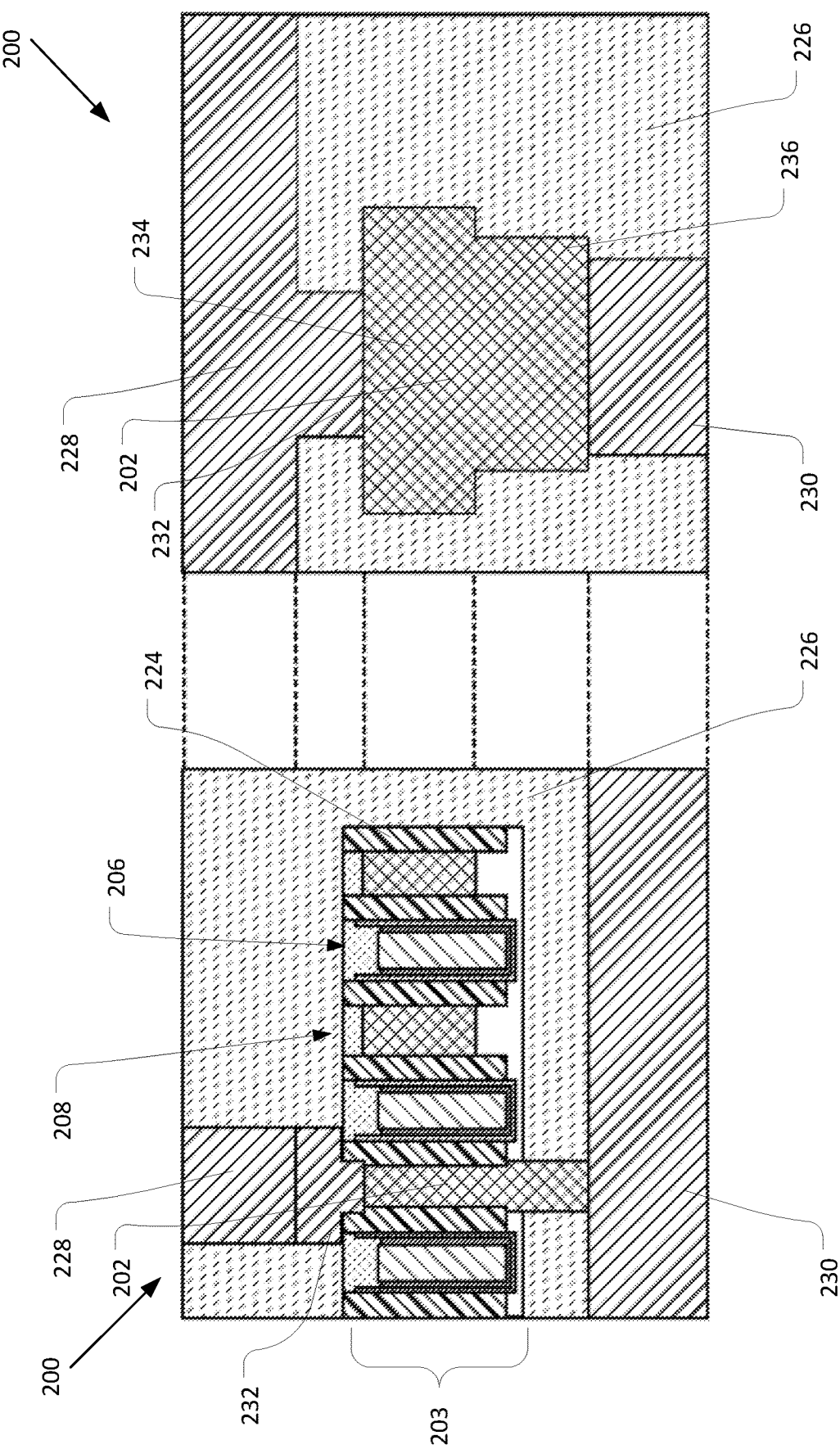
FIG. 2B illustrates a side cross-sectional view of the IC structure of FIG. 2A along the line B-B in FIG. 2A.
FIG. 2C illustrates a side cross-sectional view of the IC structure of FIG. 2A along the line C-C in FIG. 2A.

In other embodiments, the fins may be removed from the trench in which the deep trench via is formed, enabling more conductive material to be filled in the trench and thereby providing lower resistance for the deep trench via. For example, FIGS. 2A, 2B, and 2C illustrate an IC structure 200 in which the fins 204 have been removed from the region occupied by the deep trench via 202. FIG. 2A illustrates a top view of the IC structure 200, FIG. 2B illustrates a side cross-sectional view along the line B-B in FIG. 2A, and FIG. 2C illustrates a side cross-sectional view along the line C-C in FIG. 2A. The IC structure 200 may be included in a 3D IC.

The IC structure 200 may include a logic layer 203 including a plurality of fins 204 of a semiconductor material (e.g., silicon and/or another suitable material). The IC structure 200 may further include gate stacks 206 on a top surface and sidewalls of the fins 204 in respective gate regions, and diffusion electrodes 208 on a top surface and sidewalls of the fins 204 in respective diffusion regions.

In some embodiments, the IC structure 200 may further include spacers (e.g., sidewall spacers) 224 between the diffusion electrodes 208 and the gate stacks 206. Additionally, or alternatively, a dielectric 226 may be between the fins 204, above the logic layer 203, and/or below the logic layer 203. The deep trench via 202 may provide a conductive connection between a front-side interconnect 228 and a back-side interconnect 230. In some embodiments, one or more vias (e.g., via 232) may couple the deep trench via 202 to the front-side interconnect 228 and/or the back-side interconnect 230.

The logic layer 203, fins 204, gate stacks 206, diffusion electrodes 208, spacers 224, dielectric 226, front-side interconnect 228, back-side interconnect 230, and/or via 232 may be similar to corresponding structures of FIGS. 1A-1C, unless otherwise noted.

The deep trench via 202 of IC structure 200 may provide a lower resistance than the deep trench via 102 of IC structure 100, but at the cost of increased manufacturing complexity.

Figure 3A:
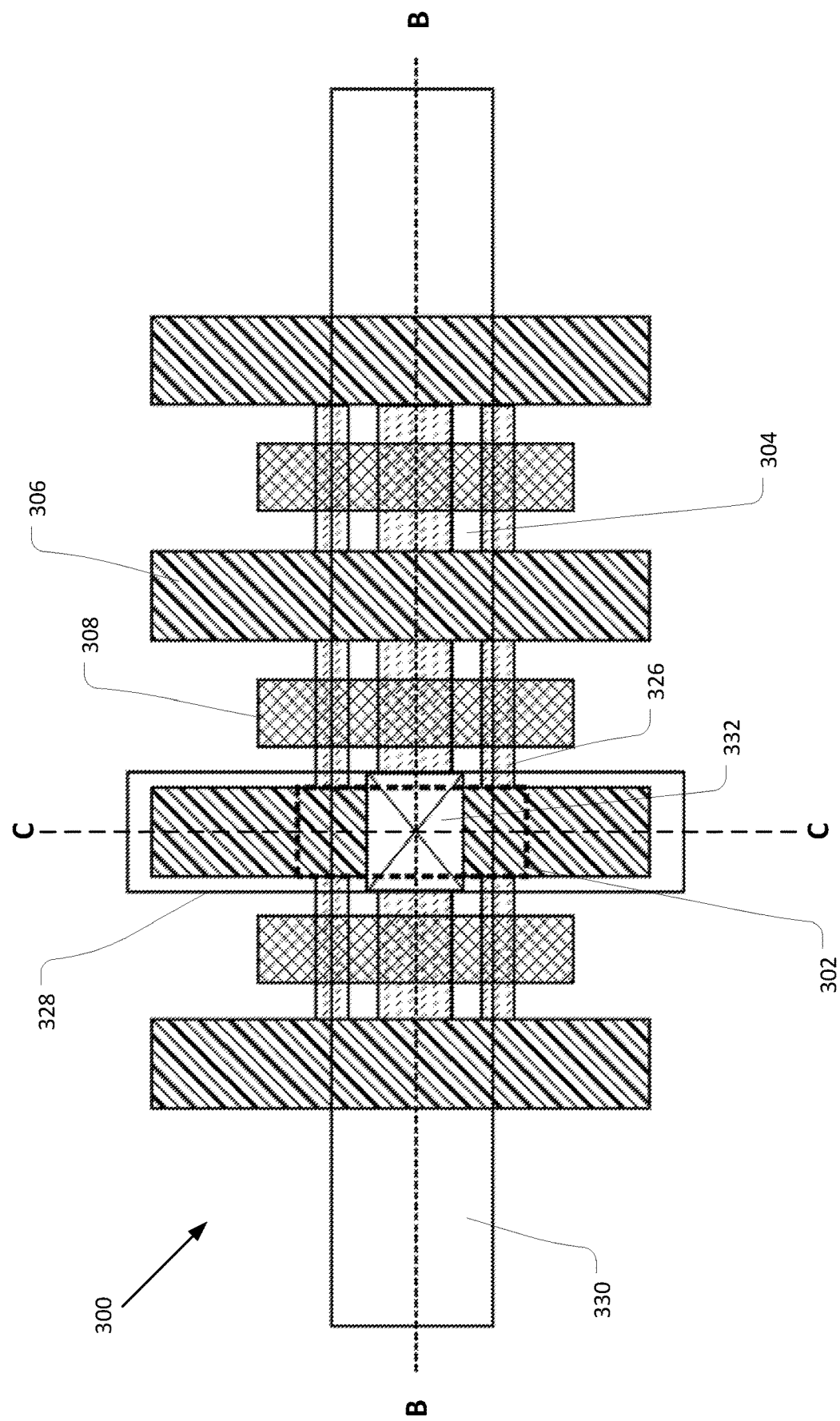
FIG. 3A illustrates a top view of another IC structure including a deep trench via in a logic layer of the IC structure, in accordance with various embodiments.
Figures 3B, 3C:
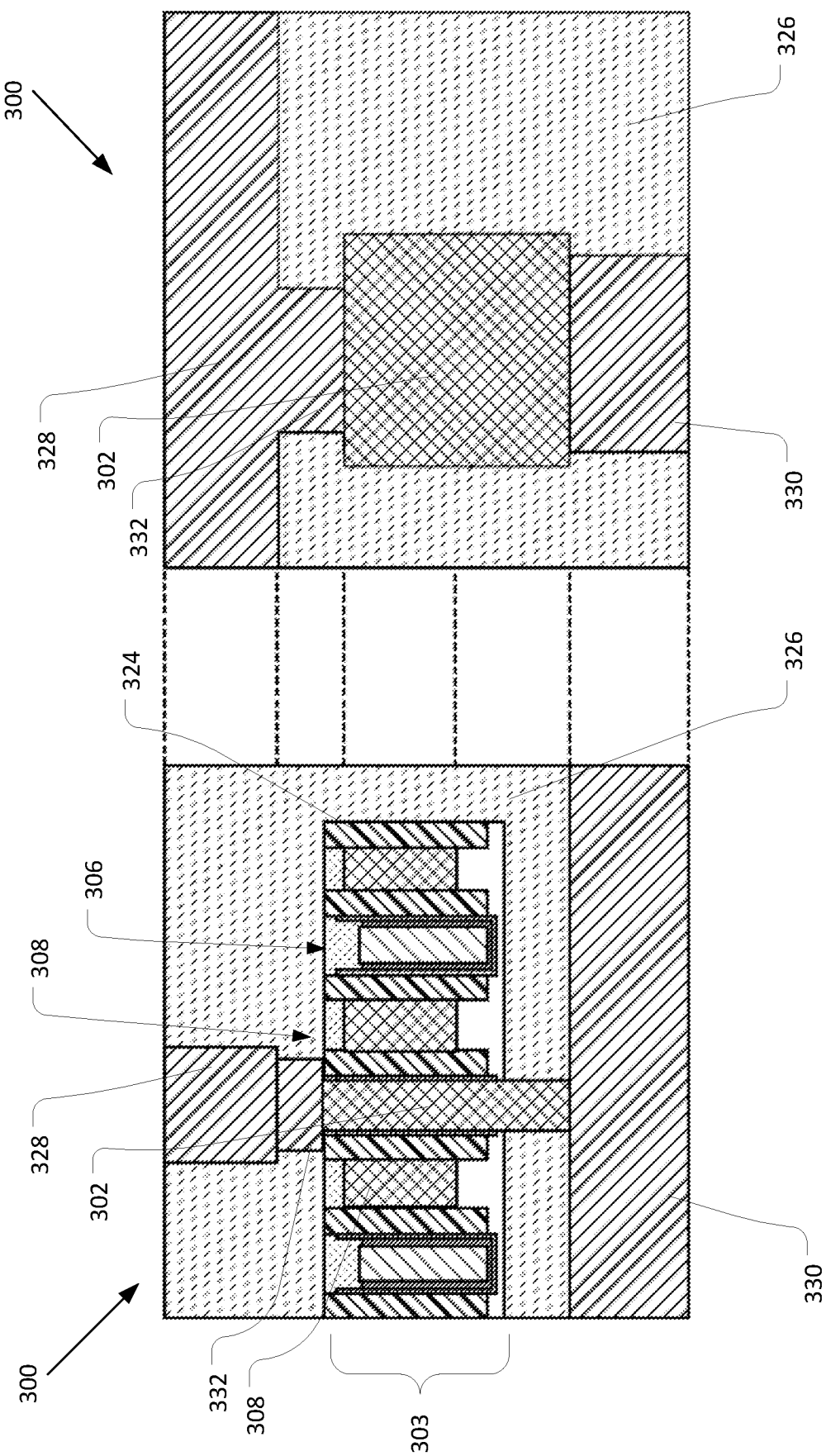
FIG. 3B illustrates a side cross-sectional view of the 3C structure of FIG. 3A along the line B-B in FIG. 3A.
FIG. 3C illustrates a side cross-sectional view of the IC structure of FIG. 3A along the line C-C in FIG. 3A.

In some embodiments, the deep trench via may be formed in the gate region of the logic layer in a 3D IC. For example, FIG. 3A illustrates a top view of an IC structure 300 including a deep trench via 302 in a gate region of a logic layer, in accordance with various embodiments. FIG. 3B illustrates a side cross-sectional view along the line B-B in FIG. 3A, and FIG. 3C illustrates a side cross-sectional view along the line C-C in FIG. 3A. The IC structure 300 may be included in a 3D IC.

The IC structure 300 may include a logic layer 303 including a plurality of fins 304 of a semiconductor material (e.g., silicon and/or another suitable material). The IC structure 300 may further include gate stacks 306 on a top surface and sidewalls of the fins 304 in respective gate regions, and diffusion electrodes 308 on a top surface and sidewalls of the fins 304 in respective diffusion regions.

In some embodiments, the IC structure 300 may further include spacers (e.g., sidewall spacers) 324 between the diffusion electrodes 308 and the gate stacks 306. Additionally, or alternatively, a dielectric 326 may be between the fins 304, above the logic layer 303, and/or below the logic layer 303.

The logic layer 303, fins 304, gate stacks 306, diffusion electrodes 308, spacers 324, and/or dielectric 326 may be similar to corresponding structures of FIGS. 1A-1C and 2A-2C, unless otherwise noted.

In various embodiments, the deep trench via 302 may be formed in a gate region of the transistor array in the logic layer 303 that would otherwise have a gate stack 306. Spacers 324 may be between the deep trench via 302 and adjacent diffusion electrodes 308. Additionally, the dielectric 326 may be between the deep trench via 302 and adjacent fins 304 that form transistors of the transistor array.

The deep trench via 302 may electrically couple a front-side interconnect 328 with a back-side interconnect 330 (e.g., via a via 332). In some embodiments, the deep trench via 302 may have the same width across the entire logic layer 303.

In various embodiments, the choice of forming the deep trench via in the gate region (e.g., the deep trench via 302) or in the diffusion region (e.g., deep trench via 102 and/or 202) may be determined based on one or more factors, such as process and/or design considerations (e.g., the termination location of logic devices). The 3D IC may include a selected one of deep trench vias in respective gate regions or deep trench vias in respective diffusion regions or a mixture of both deep trench vias in respective gate regions and deep trench vias in respective diffusion regions.

Figure 4:
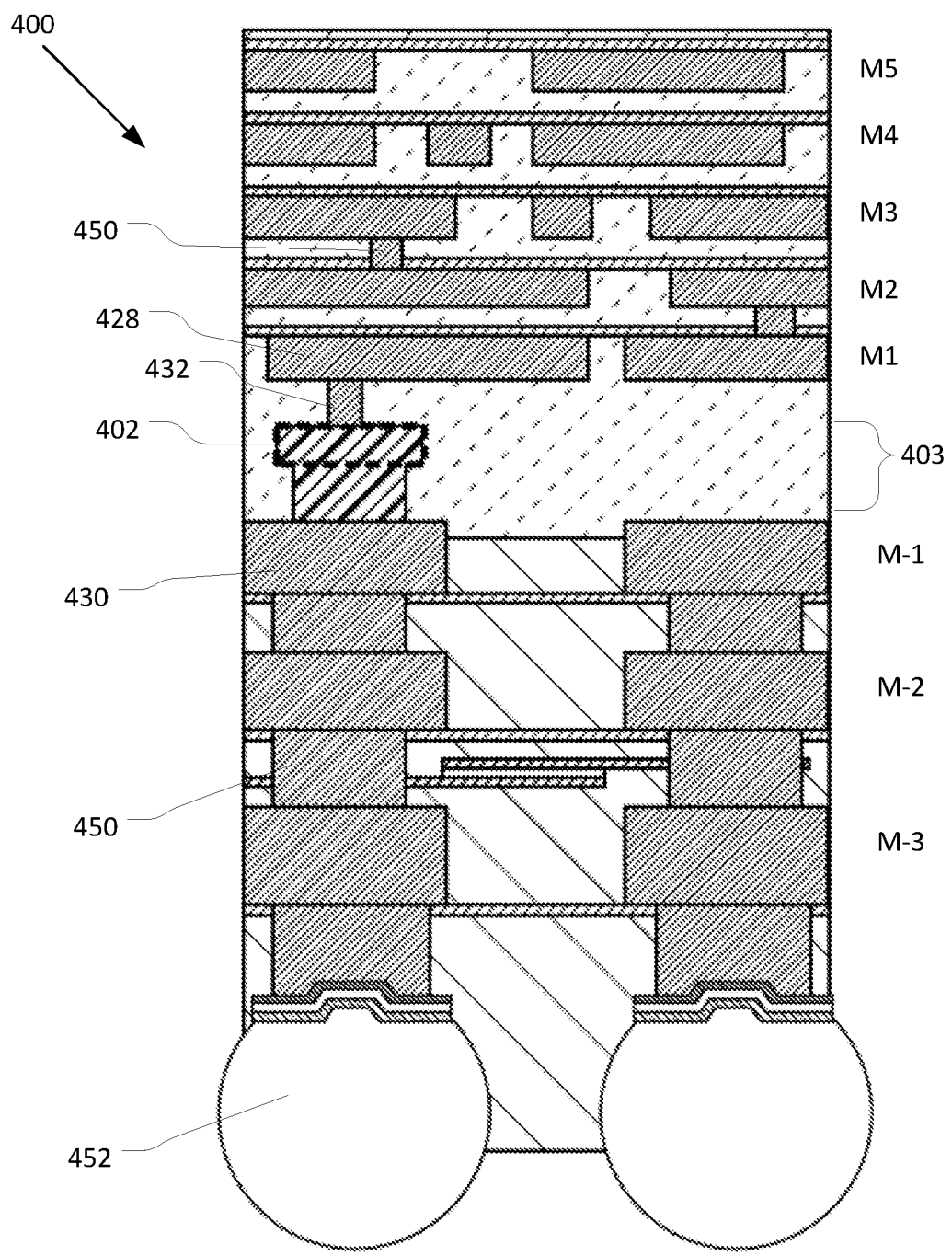
FIG. 4 illustrates a cross-sectional side view of a three-dimensional (3D) IC that includes a deep trench via in a logic layer of the 3D IC to electrically couple a front-side interconnect with a back-side interconnect of the 3D IC, in accordance with various embodiments.

FIG. 4 illustrates a cross-sectional side view of a 3D IC 400 that includes a deep trench via 402, in accordance with various embodiments. The deep trench via may correspond to the deep trench via 102, 202, and/or 302.

The deep trench via 402 may be in a logic layer 403 of the 3D IC, along with logic transistors. For example, the deep trench via 402 may be formed in a diffusion region or gate region of a dummy transistor. The dummy transistor may be included in an array of transistors that also includes logic transistors.

The 3D IC 400 may further include front-side interconnects 428 and back-side interconnects 430 on opposite sides of the logic layer 403. The front-side interconnects 428 may be in respective metal layers, e.g., M1, M2, M3, M4, M5, and the back-side interconnects 430 may be in respective back-side metal layers, e.g., M−1, M−2, M−3. It will be apparent that other embodiments may have a different number of front-side metal layers and/or back-side metal layers. The deep trench via 402 may electrically couple a front-side interconnect 428 (e.g., in front-side metal layer M1) with a back-side interconnect 430 (e.g., in back-side metal layer M−1). In some embodiments, a via 432 may electrically couple the deep trench via 402 to the front-side interconnect 428, as shown. Additional vias 450 may electrically couple interconnects 428 or 430 to other interconnects 428 or 430 in different metal layers.

It will be apparent that the 3D IC 400 may include a plurality of deep trench vias 402 in some embodiments. The deep trench vias 402 may provide a conductive path between front-side interconnects and/or circuit devices and back-side interconnects and/or circuit devices. The conductive path may be area-efficient while still providing a low resistance and capacitance. The deep trench vias 402 may enable efficient high-speed input/output (I/O) signals to be transferred across the logic layer 403 of the 3D IC 400.

In various embodiments, chip-level contacts (e.g., bumps) 452 may be coupled to the back side of the 3D IC to route signals between the 3D IC and another device (e.g., another IC).

In various embodiments, the apparatuses described herein (e.g., the IC structure 100, IC structure 200, IC structure 300, and/or 3D IC 400) may be formed on a respective dies of a wafer. For example, FIGS. 5 and 6 are top views of a wafer and dies that include one or more deep trench vias, in accordance with any of the embodiments disclosed herein.

Figure 6:
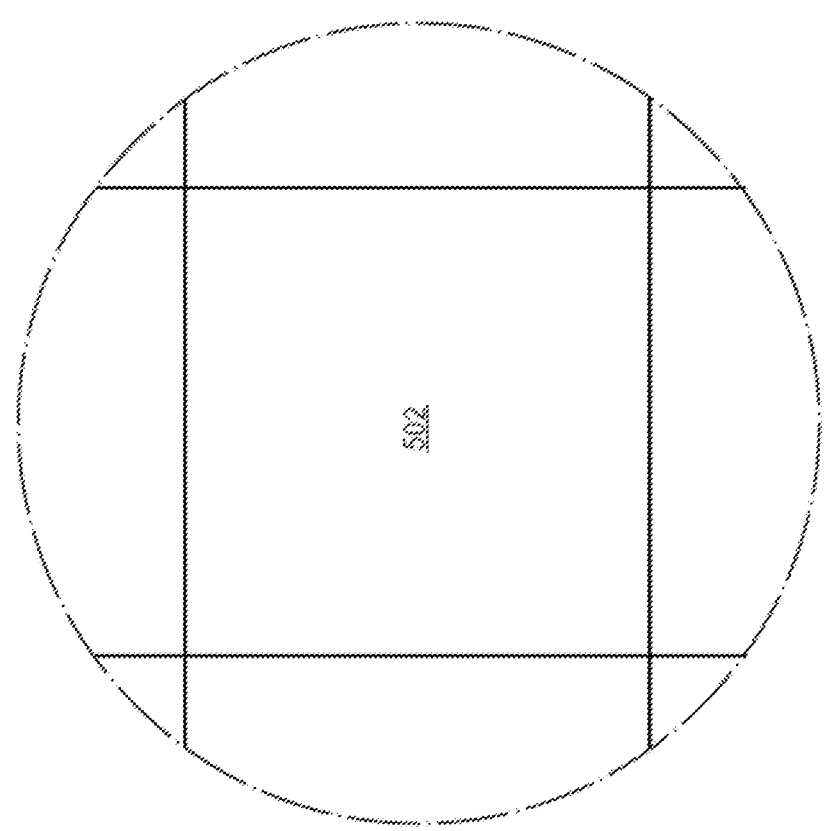
FIGS. 5 and 6 are top views of a wafer and dies that include one or more IC structures in accordance with one or more of the embodiments disclosed herein.
Figure 5:
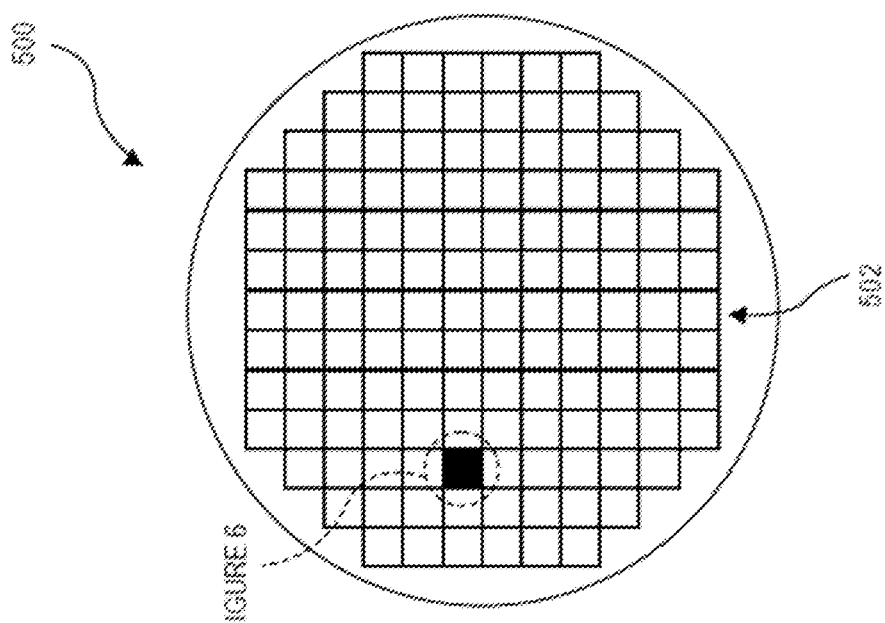

Referring to FIGS. 5 and 6, a wafer 500 may be composed of semiconductor material and may include one or more dies 502 having IC structures formed on a surface of the wafer 500. Each of the dies 502 may be a repeating unit of a semiconductor product that includes any suitable IC (e.g., the IC structure 100, IC structure 200, IC structure 300, and/or 3D IC 400). After the fabrication of the semiconductor product is complete, the wafer 500 may undergo a singulation process in which each of the dies 502 is separated from one another to provide discrete "chips" of the semiconductor product. In particular, devices that include one or more IC structures as disclosed herein may take the form of the wafer 500 (e.g., not singulated) or the form of the die 502 (e.g., singulated). The die 502 may include one or more transistors and/or supporting circuitry to route electrical signals to the transistors, as well as any other IC components. In some embodiments, the wafer 500 or the die 502 may include a memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Figure 7:
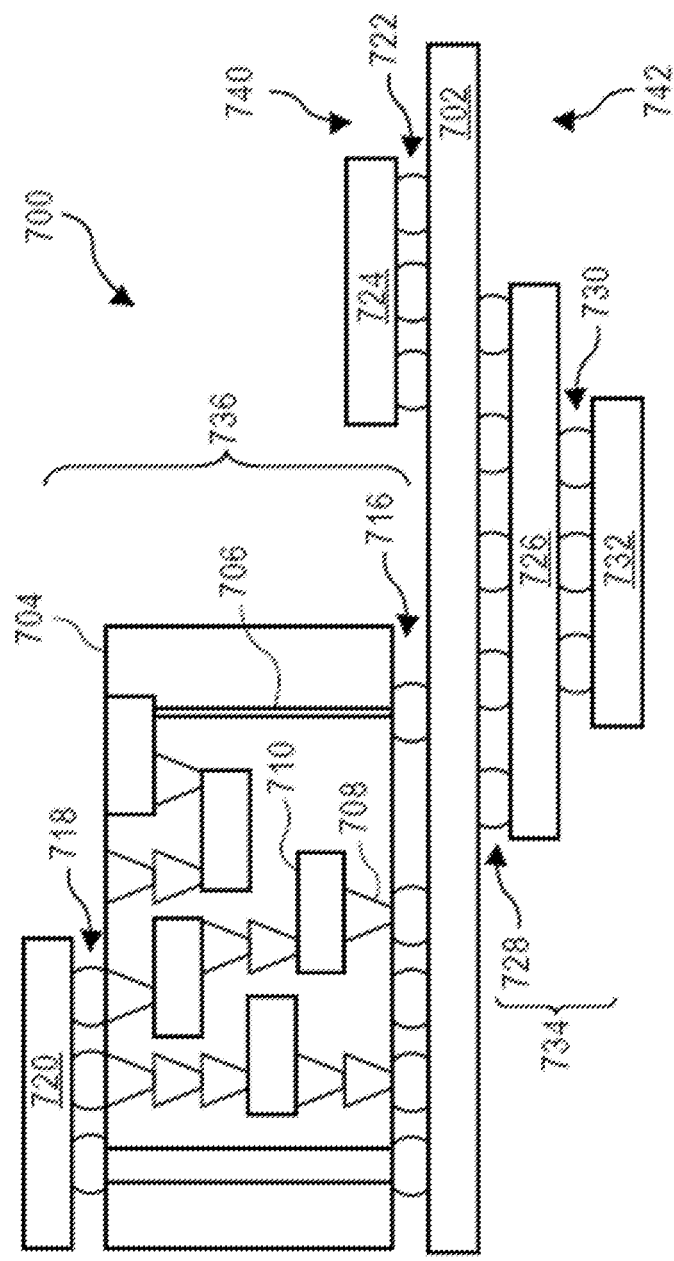
FIG. 7 is a cross-sectional side view of an integrated circuit (IC) device assembly that may include one or more IC structures, in accordance with one or more of the embodiments disclosed herein.

FIG. 7 is a cross-sectional side view of an integrated circuit (IC) device assembly 700 that may include one or more of the apparatuses described herein (e.g., the IC structure 100, IC structure 200, IC structure 300, and/or 3D IC 400), in accordance with one or more of the embodiments disclosed herein.

The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include one or more of the apparatuses described herein (e.g., the IC structure 100, IC structure 200, IC structure 300, and/or 3D IC 400).

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 6) or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
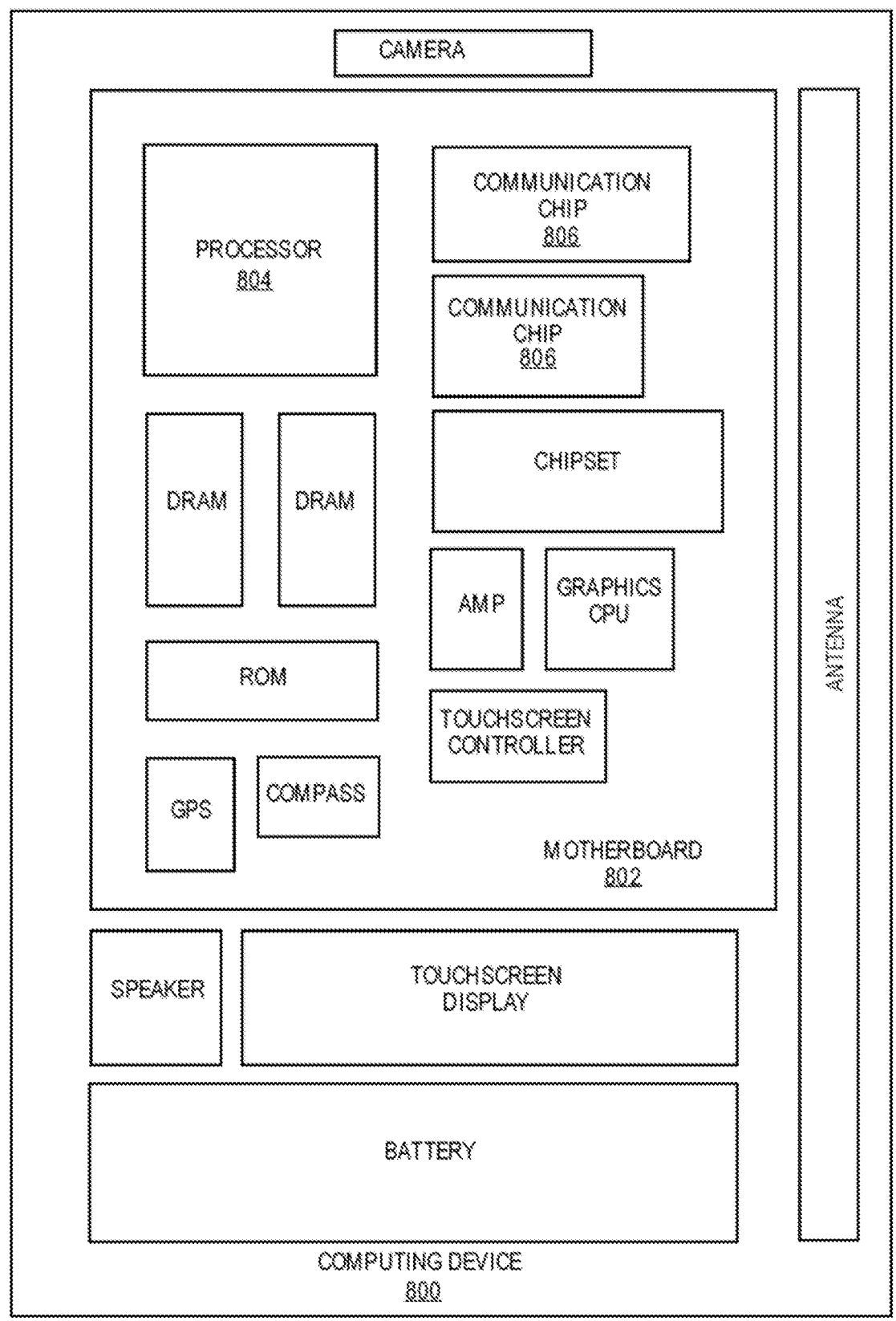
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more of the apparatuses described herein (e.g., the IC structure 100, IC structure 200, IC structure 300, and/or 3D IC 400), in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more of the apparatuses described herein (e.g., the IC structure 100, IC structure 200, IC structure 300, and/or 3D IC 400), in accordance with implementations of embodiments of the disclosure.

In further implementations, another component housed within the computing device 800 may contain an integrated circuit die that includes one or more of the apparatuses described herein (e.g., the IC structure 100, IC structure 200, IC structure 300, and/or 3D IC 400), in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a television, a set-top box, an entertainment control unit, a digital camera, a portable music player, or a digital video recorder. In further implementations, the computing device 800 may be any other electronic device that processes data.

Some non-limiting Examples of various embodiments are provided below.

Example 1 is an integrated circuit (IC) die comprising: a logic layer including a transistor array with a plurality of logic transistors, wherein the plurality of logic transistors includes a plurality of fins of semiconductor material; a front-side interconnect on a front side of the logic layer; a back-side interconnect on a back side of the logic layer; and a deep trench via in the logic layer to electrically couple the front-side interconnect with the back-side interconnect, wherein the deep trench via is in a diffusion region or a gate region of a dummy transistor of the transistor array.

Example 2 is the IC die of Example 1, wherein the dummy transistor is between individual logic transistors of the plurality of logic transistors.

Example 3 is the IC die of Example 1 or Example 2, wherein the deep trench via is in the diffusion region, and wherein a sidewall spacer is between the diffusion region and an adjacent gate region.

Example 4 is the IC die of Example 3, wherein the adjacent gate region includes a gate stack of one of the plurality of logic transistors.

Example 5 is the IC die of Example 1 or Example 2, wherein the deep trench via is in the gate region, and wherein a sidewall spacer is between the gate region and an adjacent diffusion region.

Example 6 is the IC die of Example 5, wherein the adjacent diffusion region includes a source electrode or drain electrode of one of the plurality of logic transistors.

Example 7 is the IC die of any one of Examples 1 to 6, wherein one or more fins of the plurality of fins are in the diffusion region or gate region, and wherein the deep trench via is around the one or more fins.

Example 8 is the IC die of any one of Examples 1 to 6, wherein one or more fins of the plurality of fins are adjacent the deep trench via, and wherein the one or more fins do not extend into the deep trench via.

Example 9 is the IC die of any one of Examples 1 to 8, wherein the deep trench via includes a first portion on a second portion, wherein the first portion has a greater width than a second portion in a direction that is transverse to a long axis of the plurality of fins.

Example 10 is the IC die of any one of Examples 1 to 9, further comprising a via to electrically couple the deep trench via to the front-side interconnect.

Example 11 is the IC die of any one of Examples 1 to 10, wherein the deep trench via extends across multiple fins of the plurality of fins.

Example 12 is a method comprising: forming a plurality of fins of semiconductor material in a logic layer of an integrated circuit (IC) device; forming a transistor array using the plurality of fins, wherein the transistor array includes a plurality of logic transistors and a dummy transistor; and forming a deep trench via in the logic layer, wherein the deep trench via extends through a diffusion region or a gate region of the dummy transistor to electrically couple a front-side interconnect on a front-side of the IC device with a back-side interconnect on a back-side of the IC device.

Example 13 is the method of Example 12, wherein the forming the transistor array includes forming diffusion electrodes and gate stacks of the respective logic transistors and dummy transistor on one or more fins of the plurality of fins, and wherein the forming the deep trench via includes: etching the diffusion region or gate region to remove the respective diffusion electrode or gate stack; and filling the etched diffusion region or gate region with a conductive material.

Example 14 is the method of Example 13, wherein the forming the deep trench via further includes removing one or more fins of the plurality of fins from the diffusion region or gate region.

Example 15 is the method of Example 13, wherein the filling the etched diffusion region or gate region includes filling the conductive material around one or more fins in the respective diffusion region or gate region.

Example 16 is the method of any one of Examples 13 to 15, wherein the filling the etched diffusion region includes forming a first portion and a second portion of the deep trench via, wherein the first portion is on the second portion and has a greater width than a second portion in a direction that is transverse to a long axis of the plurality of fins.

Example 17 is a computer system comprising: a circuit board; and an integrated circuit (IC) die coupled to the circuit board. The IC die includes: a logic layer including a transistor array with a plurality of fins of semiconductor material to form a plurality of logic transistors and a dummy transistor; a front-side interconnect on a front side of the logic layer; a back-side interconnect on a back side of the logic layer; and a deep trench via in the logic layer to electrically couple the front-side interconnect with the back-side interconnect, wherein the deep trench via is in a diffusion region or a gate region of the dummy transistor.

Example 18 is the computer system of Example 17, wherein the dummy transistor is between individual logic transistors of the plurality of logic transistors.

Example 19 is the computer system of Example 17 or Example 18, wherein the deep trench via is in the diffusion region, and wherein a sidewall spacer is between the diffusion region and an adjacent gate region.

Example 20 is the computer system of Example 17 or Example 18, wherein the deep trench via is in the gate region, and wherein a sidewall spacer is between the gate region and an adjacent diffusion region.

Example 21 is the computer system of Example 17, wherein one or more fins of the plurality of fins are in the diffusion region or gate region, and wherein the deep trench via is around the one or more fins.

Example 22 is the computer system of any one of Examples 17 to 21, wherein one or more fins of the plurality of fins are adjacent the deep trench via, and wherein the one or more fins do not extend into the deep trench via.

Example 23 is the computer system of any one of Examples 17 to 22, wherein the deep trench via extends across multiple fins of the plurality of fins.

Example 24 is the computer system of any one of Examples 17 to 23, further comprising one or more of an antenna, a display, a network adapter, or a memory device coupled to the IC die.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. An integrated circuit (IC) die comprising:
   a logic layer including a transistor array with a plurality of logic transistors, wherein the plurality of logic transistors includes a plurality of fins of semiconductor material;
   a front-side interconnect on a front side of the logic layer;
   a back-side interconnect on a back side of the logic layer; and
   a deep trench via in the logic layer to electrically couple the front-side interconnect with the back-side interconnect, wherein the deep trench via is in a diffusion region of a dummy transistor of the transistor array, and wherein a sidewall spacer is between the diffusion region and an adjacent gate region.

2. The IC die of claim 1, wherein the dummy transistor is between individual logic transistors of the plurality of logic transistors.

3. The IC die of claim 1, wherein the adjacent gate region includes a gate stack of one of the plurality of logic transistors.

4. The IC die of claim 1, wherein one or more fins of the plurality of fins are in the diffusion region, and wherein the deep trench via is around the one or more fins.

5. The IC die of claim 1, wherein one or more fins of the plurality of fins are adjacent the deep trench via, and wherein the one or more fins do not extend into the deep trench via.

6. The IC die of claim 1, wherein the deep trench via includes a first portion on a second portion, wherein the first portion has a greater width than a second portion in a direction that is transverse to a long axis of the plurality of fins.

7. The IC die of claim 1, further comprising a via to electrically couple the deep trench via to the front-side interconnect.

8. The IC die of claim 1, wherein the deep trench via extends across multiple fins of the plurality of fins.

9. A method comprising:
   forming a plurality of fins of semiconductor material in a logic layer of an integrated circuit (IC) device;
   forming a transistor array using the plurality of fins, wherein the transistor array includes a plurality of logic transistors and a dummy transistor;
   forming a deep trench via in the logic layer, wherein the deep trench via extends through a diffusion region or a gate region of the dummy transistor to electrically couple a front-side interconnect on a front-side of the IC device with a back-side interconnect on a back-side of the IC device; and forming a sidewall spacer between the diffusion region and an adjacent gate region or between the gate region and an adjacent diffusion region.

10. The method of claim 9, wherein the forming the transistor array includes forming diffusion electrodes and gate stacks of the respective logic transistors and dummy transistor on one or more fins of the plurality of fins, and wherein the forming the deep trench via includes:

etching the diffusion region or gate region to remove the respective diffusion electrode or gate stack; and filling the etched diffusion region or gate region with a conductive material.

11. The method of claim 10, wherein the forming the deep trench via further includes removing one or more fins of the plurality of fins from the diffusion region or gate region.

12. The method of claim 10, wherein the filling the etched diffusion region or gate region includes filling the conductive material around one or more fins in the respective diffusion region or gate region.

13. The method of claim 10, wherein the filling the etched diffusion region includes forming a first portion and a second portion of the deep trench via, wherein the first portion is on the second portion and has a greater width than a second portion in a direction that is transverse to a long axis of the plurality of fins.

14. A computer system comprising:
a circuit board; and
an integrated circuit (IC) die coupled to the circuit board, wherein the IC die includes:
a logic layer including a transistor array with a plurality of fins of semiconductor material to form a plurality of logic transistors and a dummy transistor;
a front-side interconnect on a front side of the logic layer;
a back-side interconnect on a back side of the logic layer; and
a deep trench via in the logic layer to electrically couple the front-side interconnect with the back-side interconnect, wherein the deep trench via is in a diffusion region or a gate region of the dummy transistor; and
a sidewall spacer between the diffusion region and an adjacent gate region or between the gate region and an adjacent diffusion region.

15. The computer system of claim 14, wherein the dummy transistor is between individual logic transistors of the plurality of logic transistors.

16. The computer system of claim 14, wherein the deep trench via is in the diffusion region, and wherein the sidewall spacer is between the diffusion region and the adjacent gate region.

17. The computer system of claim 14, wherein the deep trench via is in the gate region, and wherein the sidewall spacer is between the gate region and the adjacent diffusion region.

18. The computer system of claim 14, wherein one or more fins of the plurality of fins are in the diffusion region or gate region, and wherein the deep trench via is around the one or more fins.

19. The computer system of claim 14, wherein one or more fins of the plurality of fins are adjacent the deep trench via, and wherein the one or more fins do not extend into the deep trench via.

20. The computer system of claim 14, wherein the deep trench via extends across multiple fins of the plurality of fins.

21. The computer system of claim 14, further comprising one or more of an antenna, a display, a network adapter, or a memory device coupled to the IC die.

22. An integrated circuit (IC) die comprising:
a logic layer including a transistor array with a plurality of logic transistors, wherein the plurality of logic transistors includes a plurality of fins of semiconductor material;
a front-side interconnect on a front side of the logic layer;
a back-side interconnect on a back side of the logic layer; and
a deep trench via in the logic layer to electrically couple the front-side interconnect with the back-side interconnect, wherein the deep trench via is in a gate region of a dummy transistor of the transistor array, and wherein a sidewall spacer is between the gate region and an adjacent diffusion region.

23. The IC die of claim 22, wherein the dummy transistor is between individual logic transistors of the plurality of logic transistors.

24. The IC die of claim 22, wherein the adjacent diffusion region includes a source electrode or drain electrode of one of the plurality of logic transistors.

25. The IC die of claim 22, wherein one or more fins of the plurality of fins are in the gate region, and wherein the deep trench via is around the one or more fins.

26. The IC die of claim 22, wherein one or more fins of the plurality of fins are adjacent the deep trench via, and wherein the one or more fins do not extend into the deep trench via.

* * * * *